United States Patent [19]
Wang et al.

[11] Patent Number: 5,414,299
[45] Date of Patent: May 9, 1995

[54] SEMI-CONDUCTOR DEVICE INTERCONNECT PACKAGE ASSEMBLY FOR IMPROVED PACKAGE PERFORMANCE

[75] Inventors: Tsing-Chow Wang, San Jose; Louis H. Liang, Los Altos, both of Calif.

[73] Assignee: VLSI Technology, Inc., San Jose, Calif.

[21] Appl. No.: 126,288

[22] Filed: Sep. 24, 1993

[51] Int. Cl.$^6$ .................................. H01L 23/48
[52] U.S. Cl. ............................ 257/702; 257/737
[58] Field of Search ........... 257/702, 737, 701, 660, 257/922, 921

[56] References Cited

U.S. PATENT DOCUMENTS

| | | | |
|---|---|---|---|
| 4,977,441 | 12/1990 | Ohtani et al. | 257/737 |
| 4,994,411 | 2/1991 | Naito et al. | 437/209 |
| 5,029,325 | 7/1991 | Higgins, III et al. | 257/737 |
| 5,049,526 | 9/1991 | McShane et al. | 437/211 |
| 5,075,760 | 12/1991 | Nakashima et al. | 357/70 |
| 5,107,325 | 4/1992 | Nakayoshi | 357/72 |
| 5,150,193 | 9/1992 | Yasuhara et al. | 357/70 |

OTHER PUBLICATIONS

"Stress Analysis of Die Coating for a TAB Application," by Ahmad Hamzehdoost, San Jose, Calif., U.S.A., Jun. 11, 1992.

*Primary Examiner*—Rolf Hille
*Assistant Examiner*—Roy Potter
*Attorney, Agent, or Firm*—Majestic, Parsons, Siebert & Hsue

[57] ABSTRACT

A semiconductor device interconnect package assembly for TAB packages is disclosed having a central portion of material which is utilized as part of the package structure to provide scratch protection to the active surface of a semiconductor die and to the inner lead bonding areas. The central portion of material can be modified in various ways to improve the overall performance of the package, and to reduce stress generated in the TAB package due to thermal mismatch. The assembly also includes a plurality of apertures in the substrate film which overlap and expose a plurality of groups of inner lead portions. The plurality of apertures allows each group of exposed inner lead portions to be encapsulated independently from each other group. By encapsulating each of these groups separately, scratch protection is provided to the inner lead bonding areas while simultaneously reducing the stress on each of the leads due to the heating and cooling of the encapsulating material.

27 Claims, 8 Drawing Sheets

SEMI-CONDUCTOR DEVICE INTERCONNECT PACKAGE ASSEMBLY FOR IMPROVED PACKAGE PERFORMANCE

BACKGROUND OF THE INVENTION

This invention relates to semi-conductor device packages and more specifically to an improved semiconductor device package assembly for improving overall package performance.

In recent years, electronic devices have been miniaturized and decreased in overall thickness and the semiconductor devices and IC chips employed in these devices are provided with high packaged density. One conventional technique for assembling integrated circuit chips is the so-called TAB for tape automated bonding schemes. The TAB technique makes it possible to obtain fine, multiple lead patterns with a variety of pattern design variations.

According to the TAB technique, a copper foil is bonded to a polyimide film substrate and etched to a prescribed pattern, forming leads. The inner lead portions of the leads have tips that protrude over an opening at the central portion of the film substrate, and the tips are connected by gang bonding to an IC chip arranged with its active face down above the opening. The final packaging is realized using a potting resin sealing technique.

FIGS. 1 and 2 illustrate the conventional TAB technique as described above. In FIG. 1 a polyimide film substrate 103 is shown to form a hollow square. The copper foil which has been bonded to the film substrate 103 has also been etched into a pattern of leads 102. An inner portion of the metal lead portions 104 extends beyond the edge of the substrate film and into the aperture 101. A die is then attached to the inner lead portions 104, overlapping the central aperture 101.

During the initial manufacturing steps which lead to the TAB assembly shown in FIG. 1, the substrate film and the copper foil additionally occupy the area where aperture 101 is shown to be. However, this central portion of substrate film and copper foil is removed during the tape manufacturing process.

There are a number of reasons why the central portion is removed. First, the central portion is removed to facilitate the subsequent attachment of the die. The tape and the copper foil make it difficult to visually align the inner bonding leads to the corresponding pads on the die. In addition, the central portion also makes it more difficult to bond the leads to the die. By removing the central portion, the center part of the TAB assembly is opened up, facilitating both the alignment and bonding processes. Second, the central portion interferes with the encapsulation process. Since the conventional TAB technique includes the step of encapsulating the active surface of the die and the inner lead bonding areas (discussed below), the central portion only serves to interfere with this process, and therefore is removed. The result of removing the central portion of tape and copper foil is the aperture 101 illustrated in FIG. 1.

Once the die has been attached to the TAB assembly, it is then encapsulated as illustrated in FIGS. 2A and 2B. FIG. 2A is a view of the TAB assembly from the opposite side of that of FIG. 1. The encapsulation area 201 is shown to completely encapsulate the active surface of the die as well as the inner lead bonding areas 104. A clearer picture is provided in FIG. 2B, which is a cross-sectional view of the Figure of 2A taken along the line 2B. In FIG. 2B, it can be seen that the encapsulation material 201 encapsulates the active surface of the die 150, the inner bonding lead portions 104, and the electrically conductive bumps 155 which are used to connect the inner bonding lead portions 104 to bond pads on the die.

Although the above described TAB technique is widely used in the semi-conductor packaging industry, it is not without its limitations and drawbacks. For example, one such drawback is the rupturing of inner lead portions 104 from the die due to stress caused by the heating and cooling of the encapsulating material. During temperature cycle testing and during operation of the TAB package in various environments, the encapsulation material, the metal leads, and the die are each subjected to an extreme range of temperatures, which causes them to expand and contract. Such expansion and contraction place stress upon the inner lead portions 104 which, in turn, eventually causes the leads to break or rupture from the die.

One purpose of the encapsulation process is to provide scratch protection for the active surface of the die as well as for the inner lead bonding areas. However, despite the advantage of providing scratch protection, another drawback of this process is that the encapsulation material prevents and/or hinders the dissipation of heat from the active surface of the semiconductor die. Yet another drawback is that, in some encapsulation processes (such as potting, for example), the encapsulation material does not provide a desirable surface for marking and identifying the package.

In light of these drawbacks, therefore, one objective of the present invention is to provide scratch protection for the active surface of the die and for the inner lead bonding areas without hindering the dissipation of heat from the active surface of the die. Another objective of the present invention is to reduce the stress on the inner lead bonding areas while simultaneously providing scratch protection to these areas. Yet another objective of the present invention is to improve the overall performance of the TAB package.

SUMMARY OF THE INVENTION

These and additional objectives are accomplished by the various aspects of the present invention, wherein, briefly, according to a principle aspect, the central portions of electrically non-conductive substrate film and electrically conductive material are not removed, but rather are utilized as part of the package structure to provide scratch protection to the active surface of the die and to the inner lead bonding areas. In addition, the central portions of material can be modified in various ways to improve the overall performance of the package, and to reduce stress generated in the TAB package due to thermal mismatch.

According to this first aspect of the invention, a TAB assembly is disclosed in which the central portion of material remains in place and is positioned relative to a semi-conductor die such that the central portion of material provides surface protection to the active surface of the die. The central portion of material may include a portion of either the electrically conductive material, the substrate film, or both. The inclusion of the central portion of material offers significant advantages over the conventional TAB technique. For example, assuming that the central portion of material includes a central portion of electrically conductive material, the central portion of electrically conductive material can be utilized to function as a ground plane, a signal plane, or a power plane. The central portion of electrically conductive material can also be partitioned, and each of the partitions may independently be utilized to function as either a power, ground, or signal plane. By bonding an additional layer of electrically conductive material onto the opposite face of the substrate film, three layer composite central portion can be made to function as a decoupling capacitor. In addition, the central portion of material can be made to function as a Faraday shield to protect the active surface of the die from ESD. Also, by removing the substrate film and leaving the central portion of electrically conductive material, the central portion of electrically conductive material can be thermally coupled to the active surface of the die in order to dissipate heat and improve thermal performance of the package.

A second aspect of the invention is the inclusion of a plurality of apertures in the substrate film which overlap and expose a plurality of groups of inner lead portions. According to this second aspect, the present invention is directed to a substrate film having a plurality of apertures arranged about the inner lead portions such that each of the apertures overlaps and exposes a different group of inner lead portions, wherein each of the exposed groups of inner lead portions is positioned for attachment with a semiconductor die via a corresponding group of electrically conductive bumps. The plurality of apertures facilitates the alignment and bonding of the inner lead portions to the electrically conductive bumps located on the die. In addition, the creation of separate apertures allows each group of exposed inner lead portions to be encapsulated separately and independently from any other group, as discussed in greater detail below.

A third aspect of the present invention is the separate encapsulation of each of the groups of exposed inner lead portions. According to this third aspect, the present invention is directed to a plurality of encapsulation bodies, each of the encapsulation bodies comprising a mass of electrically non-conductive material, for example epoxy, wherein each of the encapsulation bodies separately encapsulates (1) at least some of the inner lead portions of a respective group of the exposed groups of inner lead portions, and (2) portions of each groups' corresponding plurality of electrically conductive bumps. By encapsulating each of these groups separately, scratch protection is provided to the inner lead bonding areas while simultaneously reducing the stress on each of the leads due to the heating and cooling of the encapsulating material.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 3C:
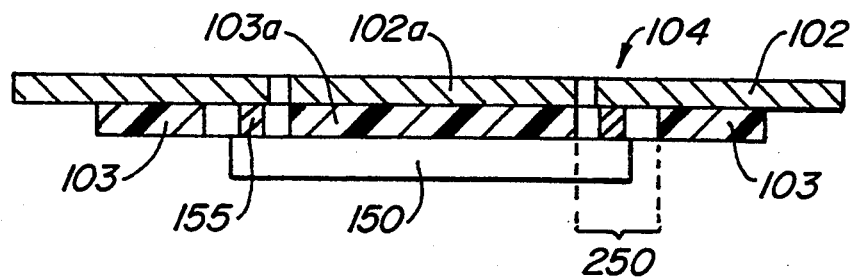
FIG. 3C is an alternate embodiment of the TAB tape of FIG. 3A, wherein the die is attached to the opposite side of the TAB assembly as that shown in FIG. 3B.
Figure 3B:
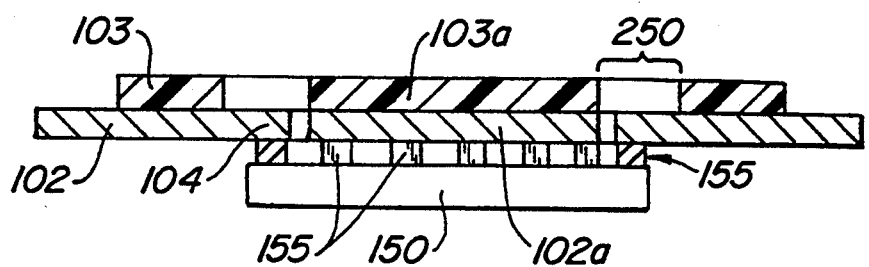
FIG. 3B is a cross-sectional view of the TAB tape of FIG. 3A taken along the line 3B.
Figure 3A:
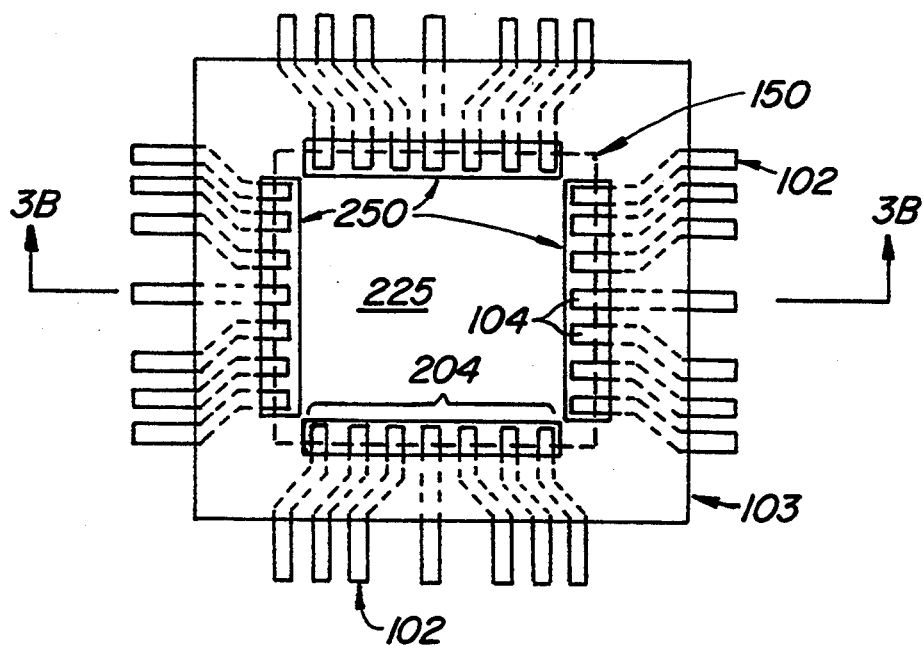
FIG. 3A is a planar view of the present invention after the die has been attached but before encapsulation of the inner lead bonding areas.

Referring first to FIG. 3A, a semiconductor device interconnect package assembly (TAB assembly) is shown with the various elements therein disclosed. For convenience purposes, reference numbers for those elements which are common to each of the figures will remain the same. The assembly of FIG. 3A comprises a flexible electrically nonconductive substrate film 103. This substrate film 103 is commonly referred to as tape, which, for example, can be comprised of a Kapton film, a polyimide film, or other high temperature, high strength, flexible dielectric material. As described in the background of the invention, a layer of copper foil is laminated onto the tape and then etched into a pattern of leads 102. A plurality of electrically conductive leads 102 includes inner lead portions 104 which are positioned suitably for attachment to a semiconductor die 150.

Figure 1:
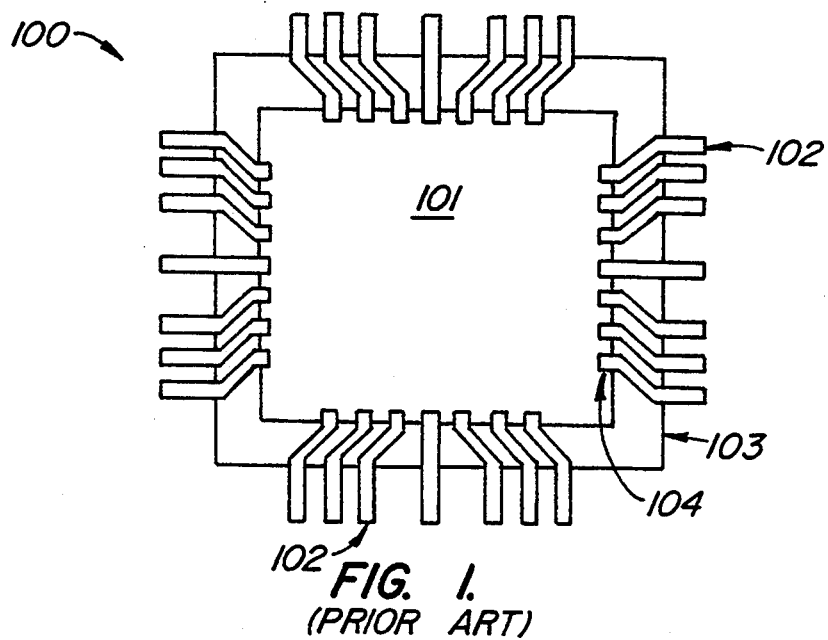
FIG. 1 is a planar view of the conventional TAB tape package before the semiconductor die is attached thereto.

Unlike the conventional TAB tape illustrated in FIG. 1, the present invention as depicted in FIG. 3A comprises a central portion of material 225 where the aperture 101 would normally be. As discussed previously, this central portion of material is normally removed during the tape manufacturing process. However, the present invention retains the central portion of material, which is comprised of either a central portion of electrically non-conductive substrate film 103a, or a central portion of electrically conductive material 102a, or both. As discussed in greater detail below, the present invention utilizes the central portion of material 225 in various ways to improve the overall performance of the TAB package and to reduce stress generated in the TAB package caused by thermal mismatch.

Another distinguishing feature between the present invention depicted in FIG. 3A and the conventional TAB assembly depicted in FIG. 1 are the plurality of apertures 250 within the tape 103, where the apertures overlap and expose a plurality of groups of inner lead portions 204. Each group of inner lead portions 204 is positioned for attachment with the semiconductor die 150. These areas where the inner lead portions 104 are exposed are herein referred to in this application and in the appended claims as "inner lead bonding areas" (ILB areas). The plurality of apertures 250 facilitates the alignment and bonding of the inner lead portions 104 to electrically conductive bumps located on the semiconductor die. These bumps are not shown in FIG. 3A, but are depicted in FIGS. 3B, 3C, and the other figures as item 155.

One advantage of forming a plurality of apertures as depicted in FIG. 3A is that the creation of separate apertures allows each group of exposed inner lead portions 204 to be encapsulated separately and independently from each other group of inner lead portions. As discussed in greater detail below, the separate encapsulation of each group of inner lead portions reduces the stress on the inner lead bonding areas caused by heating and cooling of the encapsulation material.

FIG. 3B is a cross-sectional view of the assembly of FIG. 3A taken along the line 3B. As illustrated in FIG. 3B, the die 150 is attached to the inner lead portions 104 via electrically conductive bumps 155. These conductive bumps 155 are, for example, made of gold. The technique of attaching the die to the ILB areas of the TAB package is generally known to those skilled in the art and, therefore, will not be discussed in greater detail in this application. In the embodiment of FIG. 3B, the central portion of material 225 is shown to include both a central portion of electrically non-conductive substrate film 103a and a central portion of electrically conductive material 102a. However, it should be understood that the central portion of material 225 may comprise either the central portion of non-conductive film 103a, or the central portion of conductive material 102a without necessarily comprising both at the same time, unless either or both are specifically required in order to complete a particular embodiment discussed herein.

As discussed in greater detail below, the central portion of material 225 can be used or can be modified to be used in any of the following manners: as part of the encapsulation/die surface protection; as a means to provide a reference or ground plane; as a means to provide a decoupling capacitor in a multi-layer metal TAB package; as a flat surface for marking and identifying the package; and as a heat spreader to improve thermal performance of the package.

FIG. 3C is an alternate embodiment of FIG. 3A wherein the die 150 is attached to the TAB assembly on the opposite side of the tape 103 as that shown in FIG. 3B. Although the die 150 is still shown on the bottom of the drawing, it can be seen that the relative location of the film 103 and the leads 102 in FIG. 3C are opposite to the relative location of the film 103 and leads 102 of FIG. 3B.

Figure 4C:
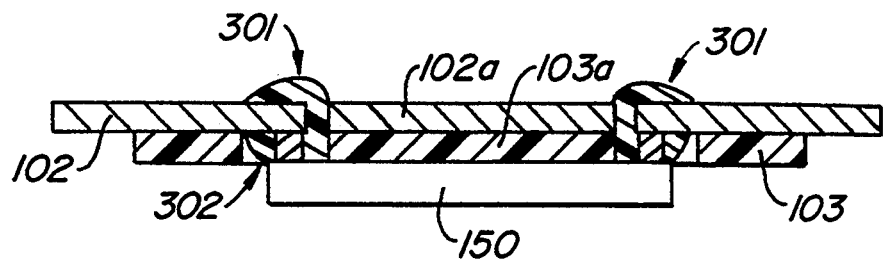
FIG. 4C is a cross-sectional view of an alternate embodiment of the TAB assembly of 4A, wherein the die is attached to the opposite side of the TAB assembly as that shown in FIG. 4B.
Figure 4B:
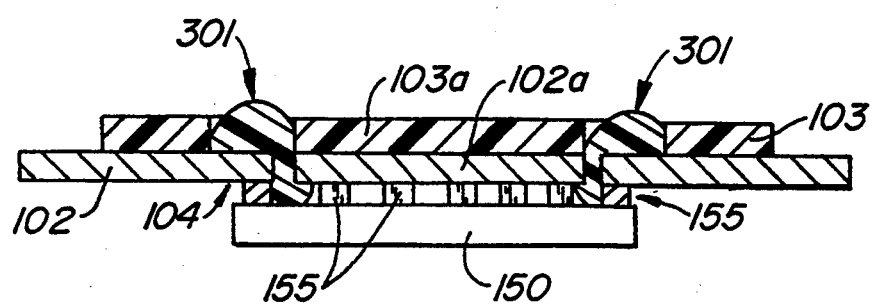
FIG. 4B is a cross-sectional view of the TAB assembly of FIG. 4A taken along the line 4B.
Figure 4A:
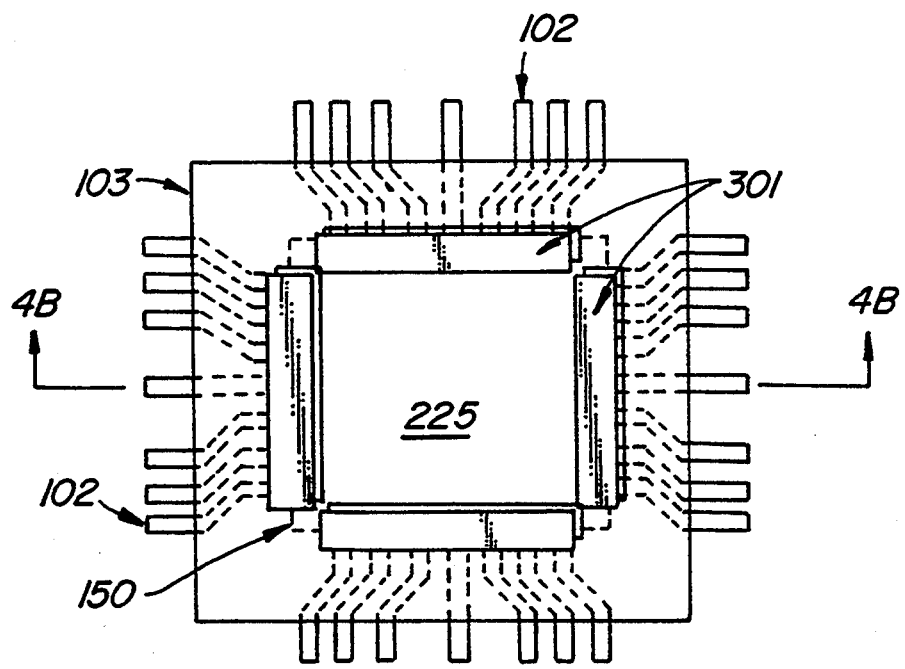
FIG. 4A is a planar view of the present invention after the die has been attached and the inner lead bonding areas encapsulated.

After the die has been attached to the TAB assembly, the inner lead bonding areas are then each individually encapsulated as shown in FIG. 4A. The result is a plurality of encapsulation bodies 301, wherein each of the bodies 301 separately encapsulates at least some of a corresponding group of inner lead portions 204 and at least portions of each groups' corresponding electrically conductive bumps 155. This encapsulation scheme is markedly different than conventional schemes. The encapsulation scheme of the present invention reduces the stress generated in the package due to thermal mismatch, thus increasing the package's reliability.

Figure 2A:
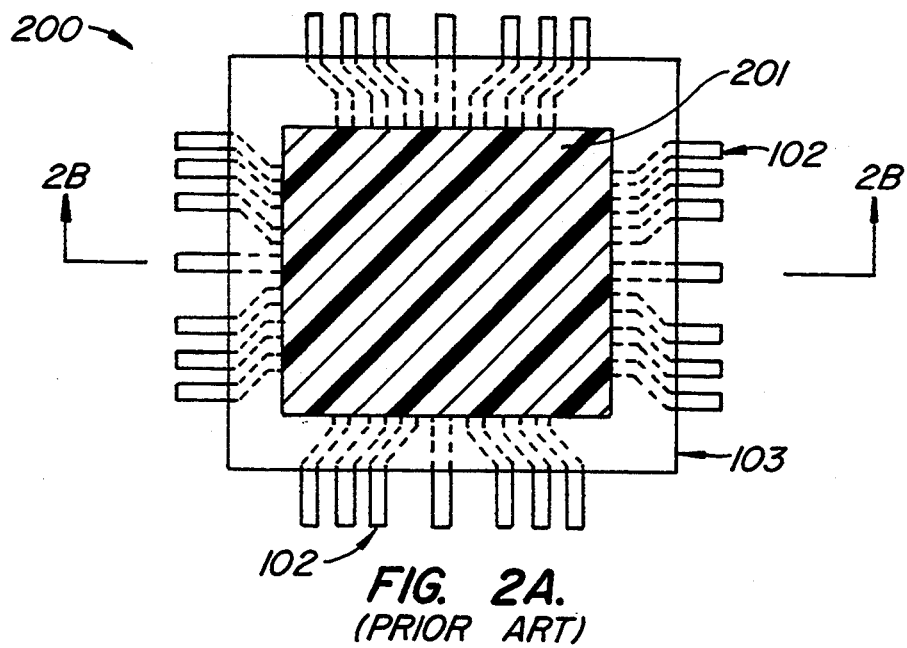
FIG. 2A is a planar view of a TAB tape package after the die has been attached and encapsulated, as seen from the opposite side as that of FIG. 1.
Figure 2B:
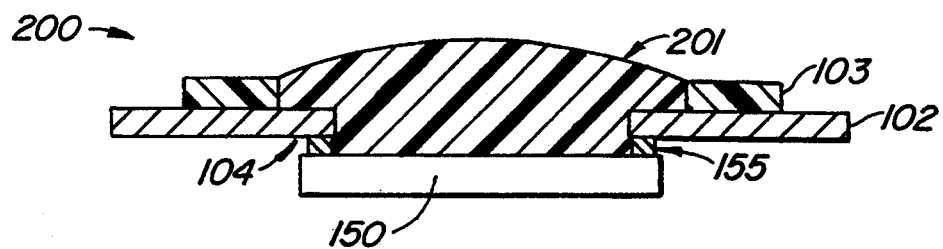
FIG. 2B is a cross-sectional view of the TAB tape in FIG. 2A taken along the line 2B.

The rationale as to why this new encapsulation scheme reduces stress in the inner lead bonding areas due to thermal mismatch is described in the article entitled *Stress Analysis of Die Coating For A TAB Application*, by Ahmad Hamzehdoost, VLSI Technology, Inc. (Jun. 11, 1992), herein incorporated by reference. Basically, encapsulation is generally applied to a semiconductor package to enforce its mechanical integrity and strength as well as to provide scratch and environmental protection to the ILB areas and the active surface of the die. However, the conventional technique of encapsulation as depicted in FIG. 2B will induce stress due to thermal mismatch among the die, die attachment, and encapsulation materials. This stress increases as the die and package size increases, and can result, for example, in the rupturing of ILB portions 104 from the die 150.

The results of the study referenced above show that the shear and normal stresses near the gold bumps (i.e. the conductive bumps which connect the die to the ILB areas) are reduced when only the ILB areas and the die surface are encapsulated, as opposed to encapsulating the ILB areas, the die surface, and a portion of the Kapton film. The present invention takes advantage of this stress reduction technique, and takes it one step further by not encapsulating either the Kapton film or the die surface.

In other words, the present invention encapsulates only the inner lead bonding areas within each aperture 250 and not the substrate film 103 or the central portion of material 225, thereby forming a plurality of encapsulation bodies 301, as illustrated in FIGS. 4A, 4B and 4C. Furthermore, utilizing the encapsulation technique as illustrated in FIG. 4A, the stress generated in each of the ILB areas is independent of the die size since, as discussed below, the die surface is not being encapsulated. Thus this encapsulation technique will enhance the reliability of the inner lead bonds for large dies.

The rationale for stress reduction using the encapsulation technique of the present invention has to do with the fact that conventional encapsulation techniques encapsulate the entire die as well as the ILB area, creating a large body of encapsulation material. The larger the body of encapsulation material, the greater the amount of expansion and contraction of this material when it is subjected to temperature extremes. This greater amount of expansion and contraction translates into a greater amount of stress being placed upon the inner lead bonds. In contrast, the present invention only encapsulates the ILB areas, and does not encapsulate the surface of the die. The die does not need to be encapsulated since scratch protection is already provided to the die by the central portion of material 225. Thus, each of the plurality of encapsulation bodies 301 contains much less encapsulation material than the conventional encapsulation body 201 (FIG. 2A). This smaller amount of encapsulation material results in a smaller amount of expansion and contraction due to heating and cooling of the encapsulation material which, in turn, translates into reduced stress for each of the ILB areas. Thus, even if the encapsulation technique were to encapsulate a portion of the substrate film surrounding the ILB areas, this technique would still result in reduced stress for the ILB areas as compared to the conventional encapsulation technique.

FIG. 4B depicts a cross-sectional view of the assembly of FIG. 4A taken along the line 4B. In FIG. 4B it can be seen that each of the encapsulation bodies 301 encapsulates a portion of the inner lead portions 104 as well as a portion of the conductive bumps 155. Thus, the function of the encapsulation material for providing scratch protection to the inner lead bonding areas is maintained while at the same time the stress due to thermal mismatch is reduced. No encapsulation of the active surface of the die is needed in the present invention since, as stated previously, the central portion of material fulfills the function normally provided by the encapsulation material by providing scratch and environmental protection to the surface of the die. Furthermore, failure analysis of the silicon die is made easier because no encapsulation etching is required.

FIG. 4C is a cross-sectional view of an alternate embodiment of the assembly of FIG. 4A, wherein the die is attached to the opposite side of the substrate film as that shown in FIG. 4B. In addition, FIG. 4C also shows that it is possible to encapsulate both the top 301 and bottom 302 portions of the inner lead bonding areas, thereby providing further protection to these areas.

An additional embodiment of FIG. 4B or FIG. 4C, not illustrated, is where the central portion of substrate film 103a is removed, leaving only the central portion of conductive material 102a. In this embodiment or either of the embodiments of FIG. 3C or FIG. 3B, the central portion of conductive material can be electrically connected to a ground, thereby acting as a Faraday shield to protect the active surface of the die from electrostatic discharge (ESD). In addition, by using the central portion of conductive material 102a to function as a Faraday shield, the present invention also provides noise protection to the TAB package.

Figure 5:
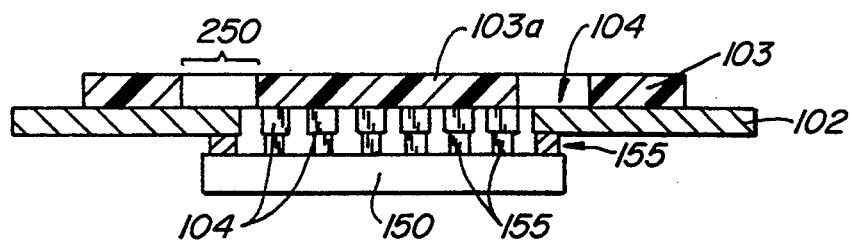
FIG. 5 is a cross-sectional view of a particular embodiment of the TAB assembly similar to that of FIG. 3B, but wherein the central portion of conductive material 102a is removed.

FIG. 5 is a cross-sectional view of an alternate embodiment of FIG. 4A wherein the central portion of material includes a central portion of substrate film 103a, but does not include a central portion of conductive material 102a. It should be noted that the embodiments of FIGS. 3B, 4B and 5 include a central portion of substrate film 103a which is suitable for marking and identifying the TAB package. Under the conventional technique described above, the marking and identifying of the TAB package is performed upon the central encapsulation body 201. However, the central portion of substrate film 103a provides a much smoother and easily markable surface than the encapsulation body 201.

Figure 6:
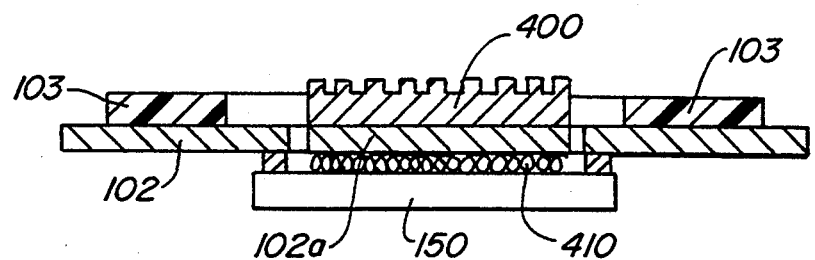
FIG. 6 is a cross-sectional view of a particular embodiment of the present invention wherein a portion of the TAB assembly is thermally coupled to a heat sink.

FIG. 6 is a cross-section of a particular embodiment of the present invention wherein the central portion of substrate film 103a is removed and the central portion of conductive material 102a is thermally coupled directly to a heat sink 400. Also shown in FIG. 6 is the active surface of the die 150 being thermally coupled via a thermally coupling material 400 to the central portion of conductive material 102a. Recall that the central portion of conductive material is typically made of copper foil, which has excellent electrical as well as thermal conductive properties. The thermally conductive material may include thermal grease, examples of which are described in the allowed application Ser. No. 07/630,113, entitled *Semiconductor Device Package With Improved Heat Dissipation Characteristics*, herein incorporated by reference. Thus, the embodiment of FIG. 6 allows for improved thermal performance of the TAB package by dissipating heat from the active surface of the die through the central portion of conductive material 102a to the heat sink 400.

Figure 7:
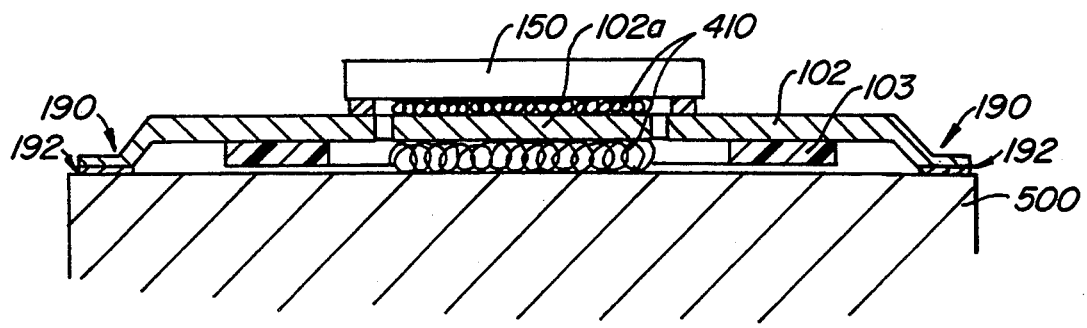
FIG. 7 is a cross-sectional view of a particular embodiment of the present invention wherein a portion of the TAB package is thermally coupled to a heat spreading area on a PC board.

FIG. 7 is an alternate embodiment for improving the thermal characteristics of the TAB package. As illustrated in FIG. 7, the active surface of the die 150 is thermally coupled via a thermal coupling material 400 to the central portion of conductive material 102a. The central portion of conductive material is, in turn, thermally coupled via a thermal coupling material to a heat spreading area on a substrate, which in this case is a printed circuit (PC) board 500. Note that the TAB package is inverted to accomplish this embodiment. Accordingly, one technique for securing the outer lead portions 190 to the PC board is through the technique of forming the outer leads 190 into a gull-wing shape and bonding them to bond pads 192 on the PC board.

Figure 8:
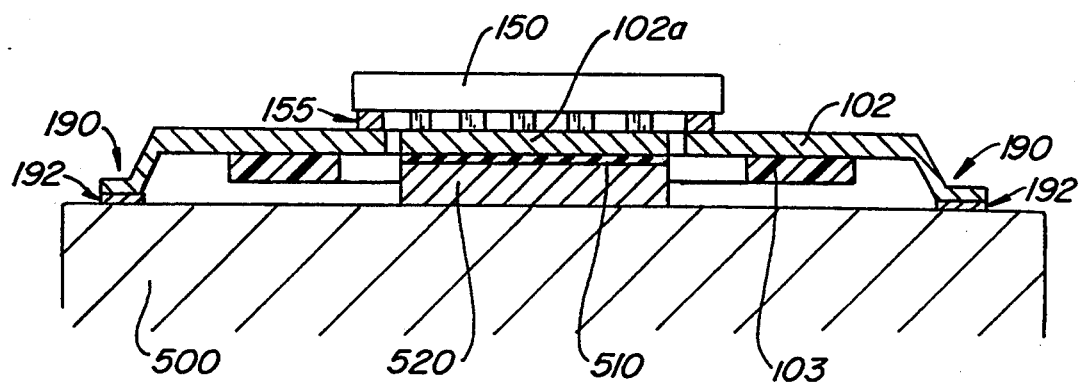
FIG. 8 is a cross-sectional view of a particular embodiment of the present invention wherein a portion of the TAB package is electrically coupled to a reference plane located on a PC board.

FIG. 8 illustrates a particular embodiment of the present invention wherein the central portion of conductive material 102a is electrically connected via an electrically conductive material to a reference plane on a substrate, which in this case is PC board 500. The reference plane 520 may either be a ground plane, a signal plane, or a power plane. As discussed below, the inner lead bonding pitch crowding can be reduced by relocating some of the power/ground bonding leads to the central portion of conductive material 102a.

Again, please note that the TAB package is inverted to accomplish the embodiment illustrated in FIG. 8. An example of the electrically coupling material is electrically conductive adhesive, or reflow solder with paste.

Figure 9:
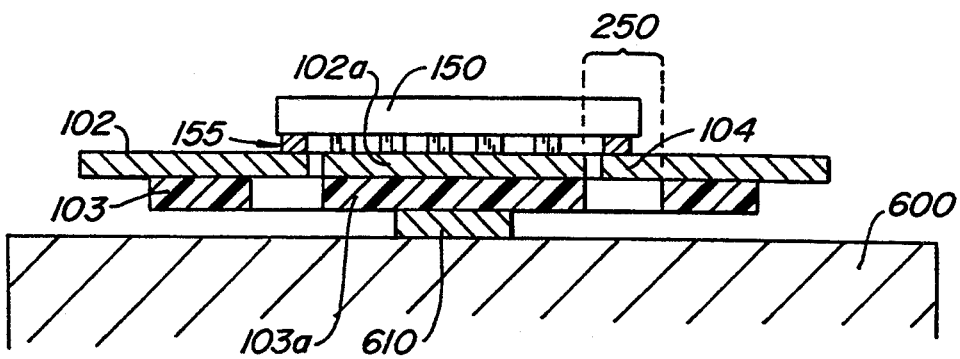
FIG. 9 is a cross-sectional view of a particular embodiment of the present invention wherein a central pad attached to the TAB package offers scratch protection for the inner lead bonding areas.

FIG. 9 is an illustration of a particular embodiment of the present invention wherein a pad 610 is attached to the surface of the central portion of material 225. The pad should have a sufficient thickness such that, when the TAB assembly is placed in contact with a substantially flat surface, with the pad in contact with the flat surface 600, the pad 610 will prevent the flat surface from contacting the inner lead bonding areas where the die is attached to the inner lead portions 104. Thus, in the embodiment of FIG. 9, the pad 610 is shown to be attached to the central portion of substrate film 103a, which prevents the inner lead bonding areas from contacting the flat surface 600. Such a flat surface could be a table or it could be another TAB package in which the TAB packages are spooled together for shipment. Although the embodiment of FIG. 9 depicts the pad 601 attached to the substrate film 103a, it is understood that another embodiment can exist where the central portion of film 103a or central portion of conductive material 102a is removed and the pad is attached directly to the remaining layer of material 102a or 103a.

Although FIGS. 5-9 are illustrated without encapsulation bodies 301, it is understood that the present invention also includes the additional embodiments wherein each of the FIGS. 5-9 are illustrated in substantially the same manner with the additional feature of encapsulation bodies (similar to those shown in FIG. 4A) encapsulating the inner lead bonding areas of the TAB package.

Figure 10A:
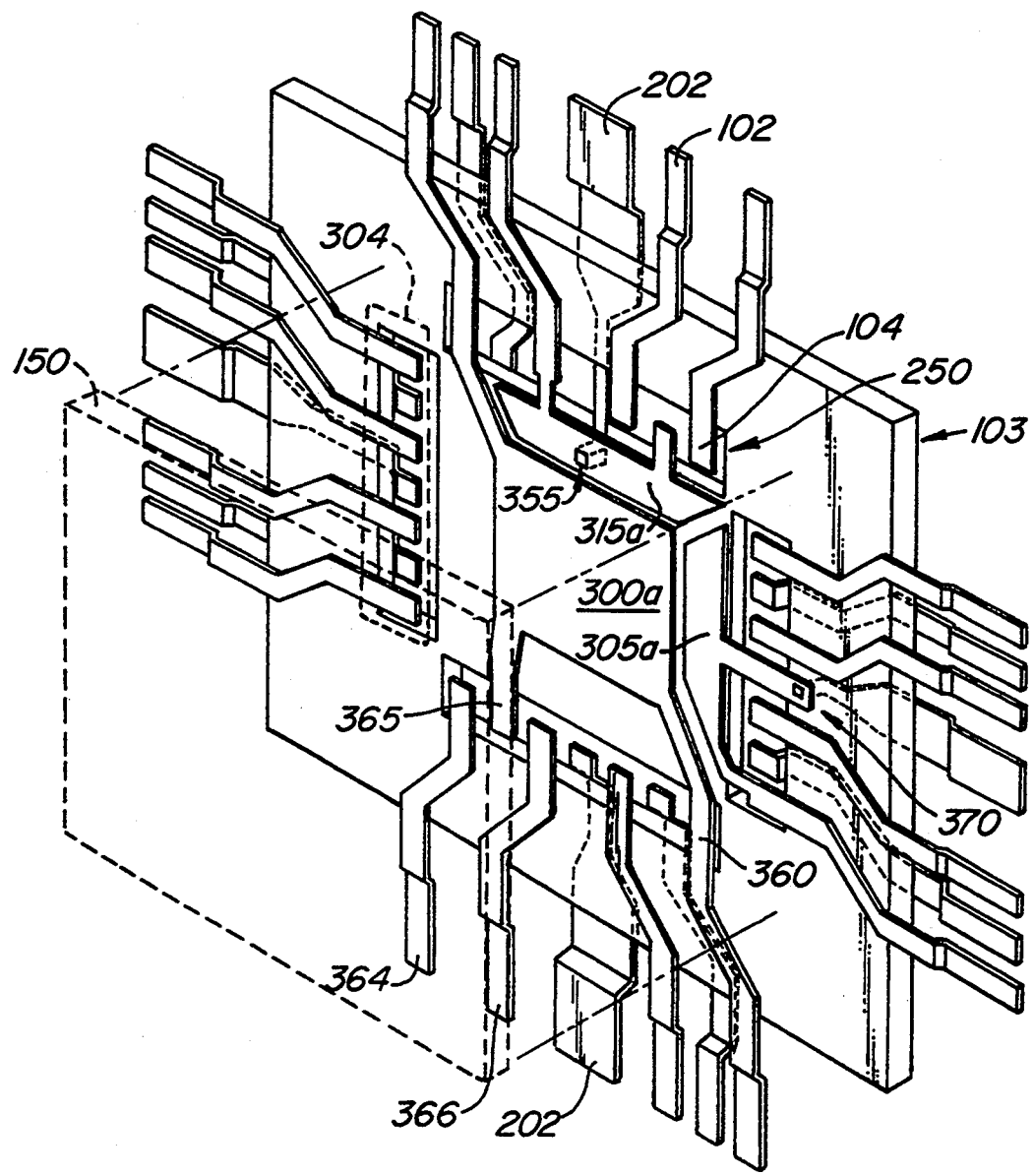
FIG. 10A is a perspective view of a multi-layer metal TAB assembly before the die is attached thereto.

FIG. 10A is a perspective view of a multi-layer metal TAB package. Essentially, the multi-layer metal TAB package includes a layer of substrate film 103 sandwiched between two layers of copper foil. The layers of copper foil are each etched individually to form upper leads 102 and lower leads 202. A plurality of apertures 250 is shown, each of which exposes a group of inner lead portions 304. This group of inner lead portion comprises both upper leads 102 and lower leads 202. In addition, the embodiment of FIG. 10a shows a central portion of conductive material partitioned into individual islands 300a, 305a and 315a. Each of these islands can be respectively attached to either a power source, a signal source, or a ground. By relocating some of the power and/or ground bonding leads to respective partitioned islands comprising the central portion of conductive material, the ILB pitch crowding can be reduced. An example of such a technique is illustrated in FIG. 10a as item 365. Here it can be seen that the central partition 300a provides a direct lead to the bonding area 365 where the die will be attached through conductive bumps (not shown) such as those discussed previously, for example. Thus, no lead is required between leads 364 and 366, resulting in reduced ILB pitch crowding.

Note that in the inner lead bonding areas, the lower leads 202 are formed to be co-planar with the upper leads 102 for attachment to the die 150 through conductive bumps (not shown), for example. It is also possible for lower leads 202 to be electrically connected to the central partitions through vias as illustrated in items 370 and 355. Also note that the lead 370 is positioned for attachment to the die through conductive bumps (not shown), whereas the lead 202 connected to island 315a through via 355 will not be attached to the die. The central islands can be connected to a power source, a ground, or a signal source via any one of the leads as illustrated by lead 360.

Figure 10B:
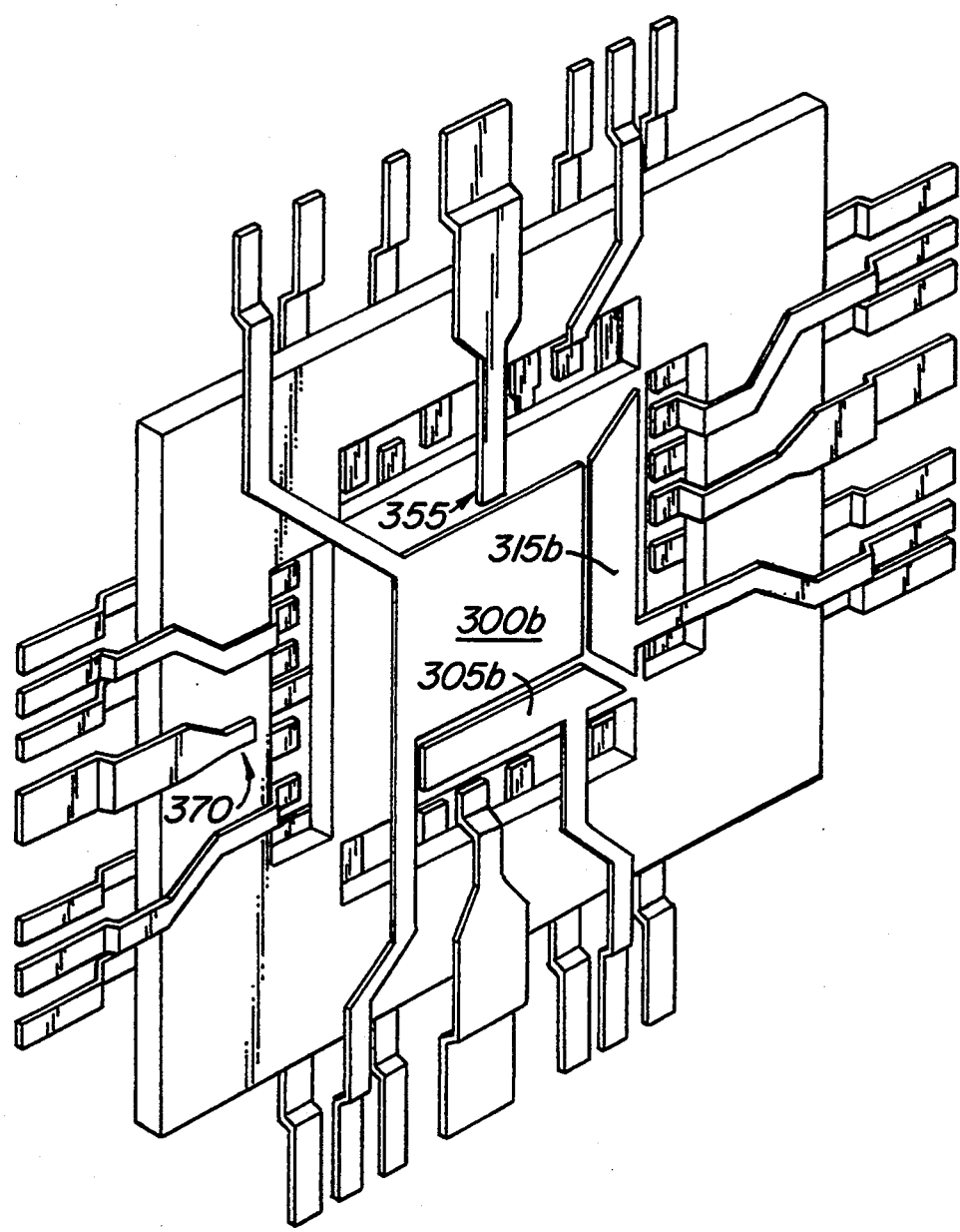
FIG. 10B is a perspective view of the reverse side of the multi-layer metal TAB assembly of FIG. 10A.

FIG. 10B is an illustration of the reverse side of the multi-layer metal TAB package shown in FIG. 10A. Since the reverse side also contains a layer of conductive material, the central portion of such conductive material can also be partitioned into individual islands 300b, 305b, and 315b as illustrated in FIG. 10B. In addition, by connecting island 300a (shown in FIG. 10A) to a positive electrode and island 300b to a negative electrode, these two islands and the substrate film separating them may jointly function together to form a decoupling capacitor, which helps insulate the TAB package from outside noise and helps improve overall package performance. Please note that a decoupling capacitor can also be formed by attaching island 300a to a negative electrode and 300b to a positive electrode.

Furthermore, although the formation of partitions in the central portion of conductive material and the reduction of ILB pitch crowding has been discussed in terms of a multi-layer metal TAB package, it should be understood that a single layer metal TAB package as illustrated in the previous FIGS. 3–9 may additionally include a central portion of partitioned islands wherein each island is respectively connected to either a power source, a ground, or a signal source.

Figure 11:
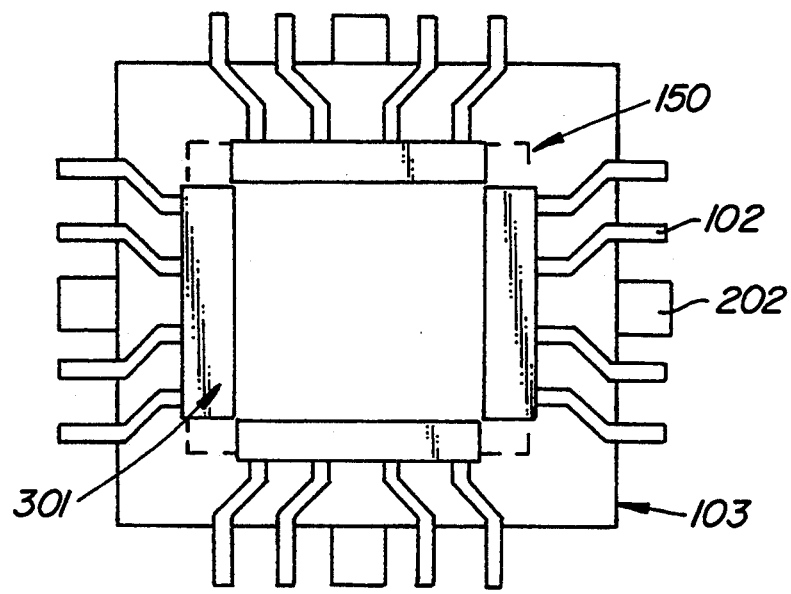
FIG. 11 is a planar view of a multi-layer metal TAB assembly after the die has been attached and the inner lead bonding areas encapsulated.

FIG. 11 is a planar view of the multi-layer metal TAB package after the die has been attached and the inner lead bonding areas encapsulated. In this figure, the die is shown to be attached to the underside of the TAB package, corresponding to the side of FIG. 10B.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

It is claimed:

1. A semiconductor device interconnect package assembly for improving scratch protection, stress relief, and electrostatic discharge protection of an active surface of a semiconductor die, and for offering improved package performance, said assembly comprising:
   a flexible electrically non-conductive substrate film having a first surface and a second surface, the two surfaces being located on opposite faces of the substrate film;
   a pattern of electrically conductive material laminated to a first surface of said flexible electrically non-conductive substrate film;
   said pattern of material forming a plurality of electrically conductive leads having inner lead portions defining an inner perimeter therein and having outer lead portions, said inner lead portions being positioned suitably for attachment to said semiconductor die; and
   a central portion of material within said inner perimeter, said central portion of material being positioned relative to said die such that it provides surface protection to said active surface of said die, said central portion of material includes a portion of said electrically conductive material.

2. The assembly of claim 1 further comprising a semiconductor die electrically connected to said inner lead portions.

3. The assembly of claim 1 wherein said central portion of material includes both a central portion of said electrically conductive material and a central portion of said substrate film, said central portion of electrically conductive material being laminated to a surface of said central portion of substrate film.

4. The assembly of claim 3 further comprising a second central portion of electrically conductive material laminated to a portion of said first surface within said central portion of substrate film, said first central portion of electrically conductive material being laminated to a portion of said second surface within said central portion of substrate film, thereby locating said first and second central portions of electrically conductive material on opposite faces of said central portion of substrate film.

5. The assembly of claim 4 further comprising a first electrical connector which electrically connects one of said central portions of electrically conductive material to a positive electrode, and a second electrical connector which electrically connects another of said central portions of electrically conductive material to a negative electrode, said first and second central portions of electrically conductive material and said central portion of substrate film being positioned relative to one another such that all three function together to form a decoupling capacitor.

6. The assembly of claim 4 further comprising means for electrically connecting said first and said second central portions of electrically conductive material to said die.

7. The assembly of claim 4 wherein at least one of said portions of electrically conductive material includes a plurality of electrically conductive partitions, each of said partitions being suitable for connection to either a power source, or a reference potential.

8. The assembly of claim 3 wherein said central portion of electrically conductive material includes a plurality of electrically conductive partitions.

9. The assembly of claim 8 wherein said central portion of electrically conductive material includes a portion of electrically conductive partitions which are grounded.

10. The assembly of claim 8 wherein said central portion of electrically conductive material includes a portion of electrically conductive partitions which are connected to a power source.

11. The assembly of claim 1 wherein said central portion of material further includes a central portion of said substrate film.

12. The assembly of claim 11 wherein said central portion of substrate film is substantially flat, thereby providing an easily markable surface upon which to mark and identify said assembly.

13. The assembly of claim 1 wherein said flexible electrically non-conductive substrate film defines therein a plurality of apertures in said substrate film overlapping and exposing a plurality of groups of said inner lead portions, each of said plurality of groups of inner lead portions being positioned for attachment with said die via a corresponding plurality of electrically conductive bumps.

14. The assembly of claim 13 further comprising a plurality of encapsulation bodies, each of said plurality of encapsulation bodies comprising a mass of electrically non-conductive material, wherein each of said encapsulation bodies separately encapsulates at least some of a corresponding group of said plurality of groups of inner lead portions and at least portions of said group's plurality of corresponding electrically conductive bumps.

15. The assembly of claim 13 further comprising a pad attached to a surface of said central portion of material such that the central portion of material is interposed between said pad and said die, said pad having sufficient thickness such that, when said assembly is placed in contact with a substantially flat surface with the pad in contact with the flat surface, said pad will prevent the flat surface from contacting inner lead bonding areas where the die is attached to said inner lead portions.

16. The assembly of claim 1 wherein said central portion of material further comprises an electrical connector which electrically connects central portion of electrically conductive material to either a power source or a reference potential.

17. The assembly of claim 16 further comprising an electrically conductive reference plane and an electrically coupling material which electrically couples said central portion of electrically conductive material directly to said reference plane.

18. The assembly of claim 17 wherein said electrically conductive reference plane is either a power plane, or a ground plane.

19. The assembly of claim 17 wherein said electrically coupling material is electrically conductive adhesive, or reflow solder with paste.

20. The assembly of claim 1 further comprising:

a heat sink thermally coupled to said central portion of electrically conductive material; and a first means for conducting thermal energy from said active surface of said die to said central portion of electrically conductive material.

21. The assembly of claim 20 wherein said heat sink is a heat spreading area located on a substrate.

22. A semiconductor device interconnect package assembly for improved package performance and for reducing stress on inner lead bonding areas which connect a semiconductor die to said assembly, said assembly comprising:

a flexible electrically non-conductive substrate film;

a pattern of electrically conductive material laminated to a first surface of said flexible electrically non-conductive substrate film;

said pattern of material forming a plurality of electrically conductive leads having inner lead portions defining an inner perimeter therein, said inner lead portions being positioned suitably for attachment to said semiconductor die; and wherein said flexible electrically non-conductive substrate film defines therein a plurality of apertures in said substrate film arranged about said inner lead portions and positioned adjacent to said inner perimeter such that each of said apertures overlaps and exposes a different group of said inner lead portions, each of said exposed groups of inner lead portions being positioned for attachment with said die via a corresponding group of bumps of a plurality of electrically conductive bumps.

23. The assembly of claim 22 further comprising a plurality of encapsulation bodies, each of said encapsulation bodies comprising a mass of electrically non-conductive material, wherein each of said encapsulation bodies separately encapsulates at least some of the inner lead portions of a respective group of said exposed groups of inner lead portions and portions of the corresponding group of said plurality of electrically conductive bumps.

24. The assembly of claim 22 further comprising a central portion of material within said inner perimeter, said central portion of material being positioned relative to said die such that it provides surface protection to an active surface of said die, said central portion of material comprising either said electrically conductive material, or said substrate film, or both.

25. A semiconductor device interconnect package assembly for improving scratch protection, stress relief, and electrostatic discharge protection of an active surface of a semiconductor die, and for offering improved package performance, said assembly comprising:

a flexible electrically non-conductive substrate film having a first surface and a second surface, the two surfaces being located on opposite faces of the substrate film;

a pattern of electrically conductive material laminated to a first surface of said flexible electrically non-conductive substrate film;

said pattern of material forming a plurality of electrically conductive leads having inner lead portions defining an inner perimeter therein and having outer lead portions, said inner lead portions being positioned suitably for attachment to said semiconductor die, wherein said flexible electrically non-conductive substrate film defines therein a plurality of apertures in said substrate film overlapping and exposing a plurality of groups of said inner lead portions, each of said plurality of groups of inner lead portions being positioned for attachment with said die via a corresponding plurality of electrically conductive bumps; and a central portion of material within said inner perimeter, said central portion of material being positioned relative to said die such that it provides surface protection to said active surface of said die, said central portion of material includes a portion of said substrate film.

26. The assembly of claim 25 further comprising a plurality of encapsulation bodies, each of said plurality of encapsulation bodies comprising a mass of electrically non-conductive material, wherein each of said encapsulation bodies separately encapsulates at least some of a corresponding group of said plurality of groups of inner lead portions and at least portions of said group's plurality of corresponding electrically conductive bumps.

27. The assembly of claim 25 further comprising a pad attached to a surface of said central portion of material such that the central portion of material is interposed between said pad and said die, said pad having sufficient thickness such that, when said assembly is placed in contact with a substantially flat surface with the pad in contact with the flat surface, said pad will prevent the flat surface from contacting inner lead bonding areas where the die is attached to said inner lead portions.

* * * * *